(12) United States Patent
Jeon et al.

(10) Patent No.: US 6,667,220 B2
(45) Date of Patent: Dec. 23, 2003

(54) METHOD FOR FORMING JUNCTION ELECTRODE OF SEMICONDUCTOR DEVICE

(75) Inventors: Kwang-seok Jeon, Icheon-shi (KR); Sang-ho Woo, Icheon-shi (KR)

(73) Assignee: Hynix Semiconductor Inc, Gyunggi-do (KR)

( * ) Notice: Subject to any disclaimer, the term of this patent is extended or adjusted under 35 U.S.C. 154(b) by 0 days.

(21) Appl. No.: 09/888,368

(22) Filed: Jun. 22, 2001

(65) Prior Publication Data

US 2002/0034856 A1 Mar. 21, 2002

(30) Foreign Application Priority Data

Jun. 29, 2000 (KR) .......................... 2000-36662

(51) Int. Cl.[7] .............................................. H01L 21/76
(52) U.S. Cl. ...................... 438/400; 438/183; 438/294; 438/300; 438/601
(58) Field of Search ................. 438/400, 300, 438/294, 183, 601

(56) References Cited

U.S. PATENT DOCUMENTS

| | | | | |
|---|---|---|---|---|
| 4,400,411 A | * | 8/1983 | Yuan et al. ................. | 438/400 |
| 4,464,824 A | | 8/1984 | Dickman et al. ............. | 29/576 |
| 5,413,947 A | | 5/1995 | Kim et al. .................. | 437/41 |
| 5,432,104 A | | 7/1995 | Sato .......................... | 437/31 |
| 5,733,827 A | * | 3/1998 | Tehrani et al. .............. | 438/572 |
| 5,753,555 A | * | 5/1998 | Hada .......................... | 438/300 |
| 5,840,613 A | * | 11/1998 | Sato ........................... | 438/320 |
| 5,972,741 A | * | 10/1999 | Kubo et al. .................. | 438/138 |
| 5,976,936 A | * | 11/1999 | Miyajima et al. ............ | 438/268 |
| 6,342,421 B1 | * | 1/2002 | Mitani et al. ................ | 438/300 |
| 6,372,583 B1 | * | 4/2002 | Tyagi .......................... | 438/300 |
| 6,406,950 B1 | * | 6/2002 | Dakshina-Murthy ........ | 438/183 |

OTHER PUBLICATIONS

Wolf and Tauber, Silicon Processing for the VSLI Era, vol. 1, 2nd ed., , Lattice Press, 2000, pp. 245–247, 740–1, 826–7.*

* cited by examiner

Primary Examiner—Michael S. Lebentritt
Assistant Examiner—Micheal K. Luhrs
(74) Attorney, Agent, or Firm—Marshall, Gerstein & Borun LLP

(57) ABSTRACT

A method for forming a junction electrode of a semiconductor device where a gate is formed on a semiconductor substrate by using a predetermined device structure, a contact hole is formed by stacking an interlayer insulation film on the gate, and n-type and p-type junction electrodes are formed in the contact hole according to an epitaxial growth method, thereby preventing a defect due to the implantation and improving yields of the semiconductor devices. Moreover, a selective silicon growth method may be employed in a narrow junction portion, thereby reducing the number of processes, prime cost, and time. In addition, performance of the electrode is exemplary and homogeneous, a result which has not been achieved using conventional implantation methods.

13 Claims, 8 Drawing Sheets

METHOD FOR FORMING JUNCTION ELECTRODE OF SEMICONDUCTOR DEVICE

BACKGROUND

1. Technical Field

The disclosed method relates to a method for forming a junction electrode of a semiconductor device, and in particular to an improved method for forming a junction electrode of a semiconductor device that prevents a defect due to an implantation. The method improves yield by forming a gate on a semiconductor substrate through use of a predetermined device structure, forming a contact hole by stacking an interlayer insulation film on the gate, and forming n-type and p-type junction electrodes in the contact hole according to an epitaxial growth method.

2. Description of the Background Art

In general, when fabricating a semiconductor device using an n-MOS and p-MOS, a device isolation film is formed on a semiconductor substrate and a gate oxide film and a gate electrode layer are stacked thereon, thereby forming a gate. An interlayer insulation film is stacked on the gate, thereby forming a contact hole to be connected to the gate and active regions. Thereafter, n-type and p-type junction electrodes are formed in the contact hole to connect interconnection lines of the upper and lower layers.

FIGS. 1a to 1g illustrate sequential steps of a conventional method for forming a junction electrode of a semiconductor device.

As illustrated in FIG. 1a, a gate(not shown) is formed on a semiconductor substrate 1 having a predetermined device structure. An interlayer insulation film 2 is stacked over the resultant structure, and a masking etching is performed thereon to form an n-type contact hole 3 and a p-type contact hole 4 connected to the gate or active regions.

As depicted in FIG. 1b, a polysilicon layer 5 is filled in the n-type and p-type contact holes 3 and 4. A first photoresist film 6 is then stacked with an opening exposing a portion of the polysilicon layer 5 over the n-type contact hole 3. Thereafter, n-type ions 7 are implanted into the opening of the first photoresist film 6, thereby forming an n-type electrode 8 as shown in FIG. 1c.

Referring to FIG. 1d, the first photoresist film 6 is removed, and a second photoresist film 9 is stacked with an opening exposing the polysilicon layer 5 over the p-type contact hole 4. Thereafter, p-type ions 10 are implanted into the opening, thereby forming a p-type electrode 11 as shown in FIG. 1e.

As illustrated in FIG. 1f, a pattern photoresist film 12 is formed over a prescribed portion of the polysilicon layer that correspond to desired positions of n-type and p-type junction electrodes 14 and 16 (shown in FIG. 1g) and an unnecessary portion of the polysilicon layer 5 is removed to form the n-type and p-type junction electrodes 14 and 16 shown in FIG. 1g.

FIGS. 2a and 2b illustrate sequential steps of another conventional method for forming a junction electrode of a semiconductor device, which is almost identical to the above-described method. However, a spacer film 18 is stacked on the n-type and p-type contact holes 3 and 4 formed by etching the interlayer insulation film 2, and the n-type and p-type electrodes 14, 16 are formed by etching the resultant structure. As a result, spacers 19 are formed on the inside walls.

The conventional methods described previously form the p-type and n-type junction electrodes based on the ion implantation process. However, a growth-type impurity may be generated in depositing a silicon film, a silicon oxide film or a silicon nitride film in a succeeding process, thereby reducing a yield of the semiconductor device. In particular, a source gas must be alternately used, which results in poor production.

In addition, a height of the junction electrode must be restricted in the implantation process. In the case that the source gas is insufficient during production of a final electrode junction portion, a depletion may occur that deteriorates a characteristic of the semiconductor device. Moreover, the mask process must be carried out about three times, which increases the prime cost of mass production.

SUMMARY OF THE DISCLOSURE

In response to the shortcomings of the convention art, a method is disclosed for forming a junction electrode of a semiconductor device that prevents defects due to implantation, thereby improving the yield of semiconductor devices. The disclosed method for forming a junction electrode includes forming an n-type contact hole by stacking an interlayer insulation film on a semiconductor substrate having a predetermined device structure and then stacking a first photoresist film on the inter layer insulation film. Masking etching on the resultant structure is then performed to form the n-type contact hole. Next, an n-type junction electrode is grown in the n-type contact hole using a selective epitaxial growth method. The first photoresist film is then removed. A p-type contact hole is then formed by stacking a second photoresist film and masking etching the resultant structure. The second photoresist film is then removed and the p-type contact hole is filled with a spacer film. A third photoresist film is then stacked except for a portion over the p-type contact hole. Spacers are then formed out of the spacer film on inside walls of the p-type contact hole. Finally, a p-type junction electrode is grown by growing silicon in the p-type contact hole using the selective epitaxial growth method.

BRIEF DESCRIPTION OF THE DRAWINGS

The disclosed method will be described with reference to the accompanying drawings, which are given only by way of illustration and are not limiting of the present disclosure, wherein.

DETAILED DESCRIPTION OF THE PREFERRED EMBODIMENTS

FIGS. 3a through 3f illustrate sequential steps of the disclosed method for forming the junction electrode of the semiconductor device.

Figure 1A:
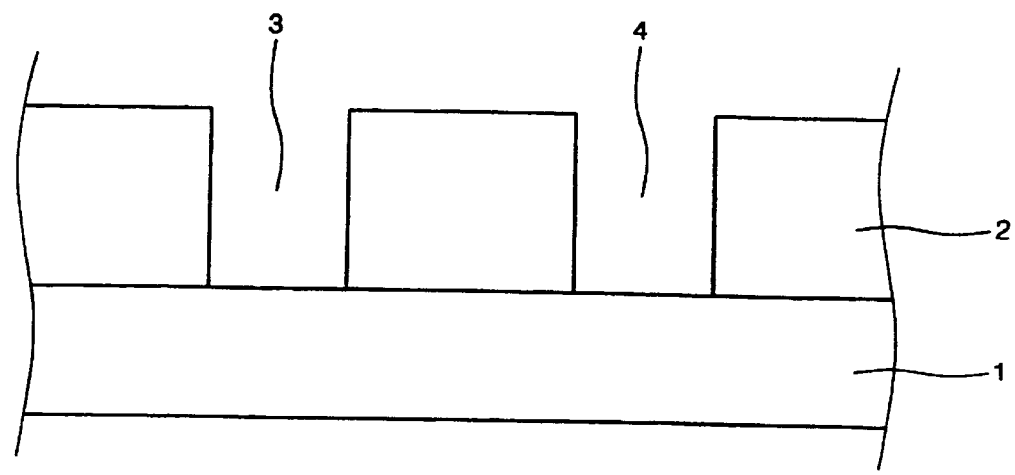
FIGS. 1a to 1g illustrate sequential steps of a conventional method for forming a junction electrode of a semiconductor device.
Figure 1B:
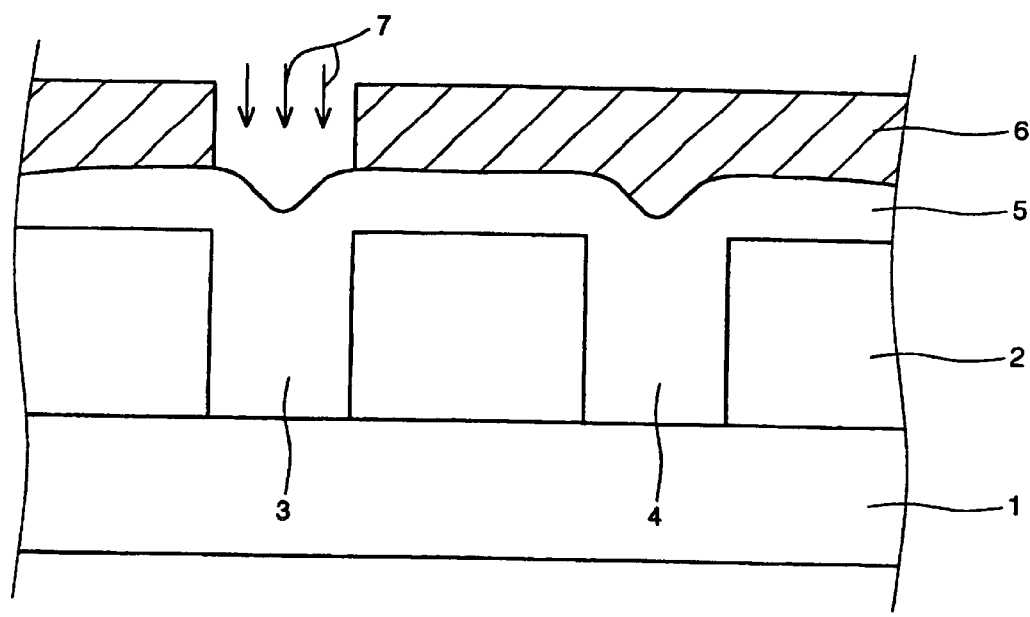
Figure 1C:
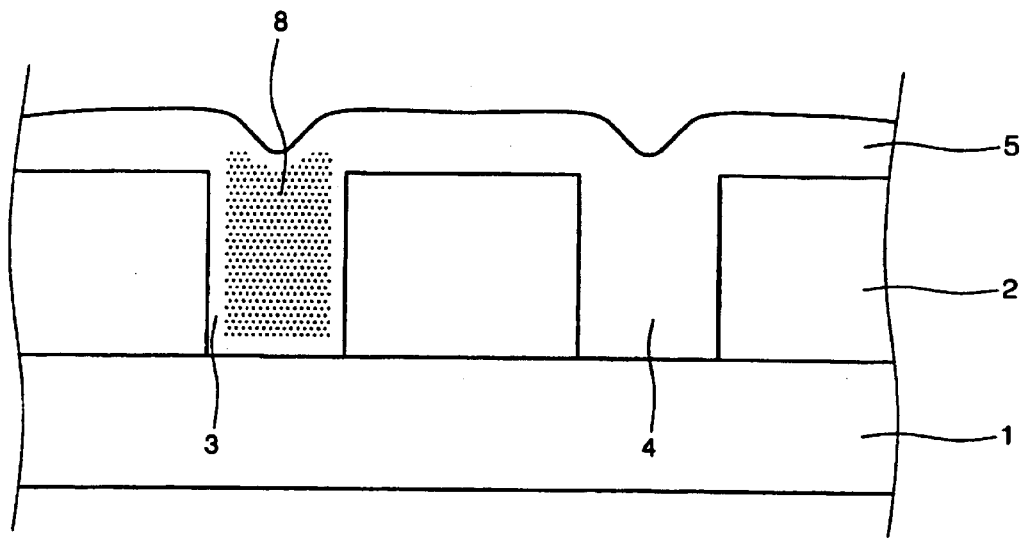
Figure 1D:
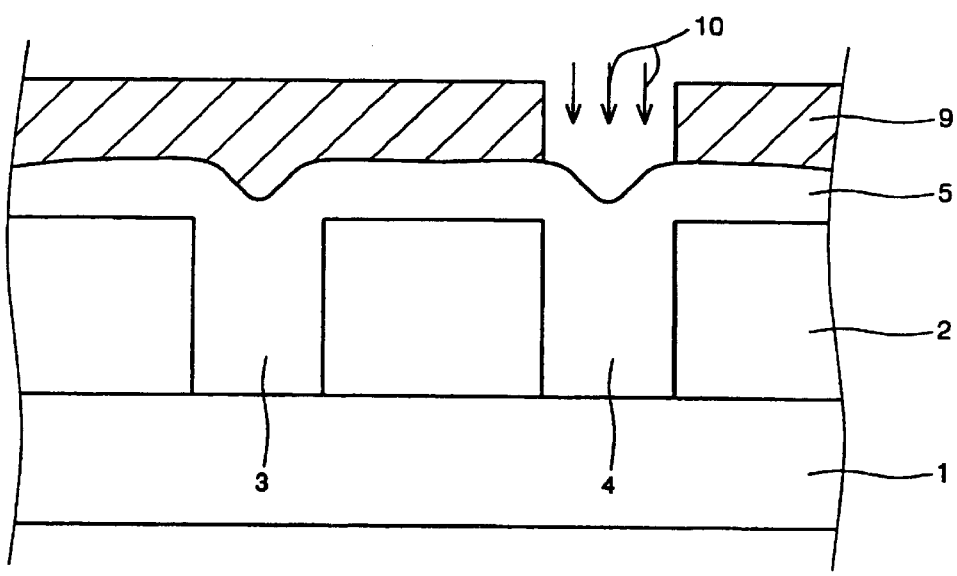
Figure 1E:
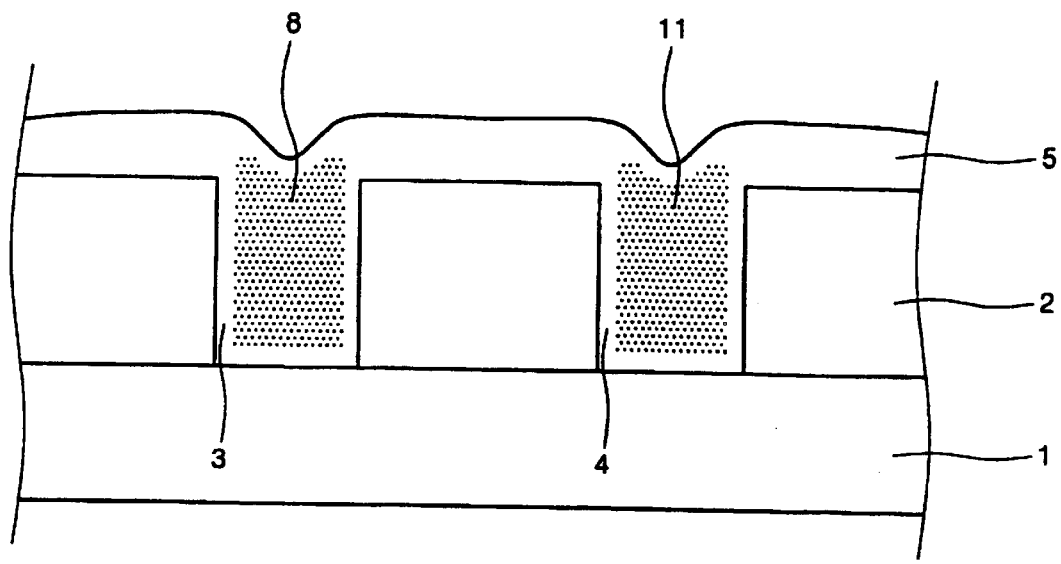
Figure 1F:
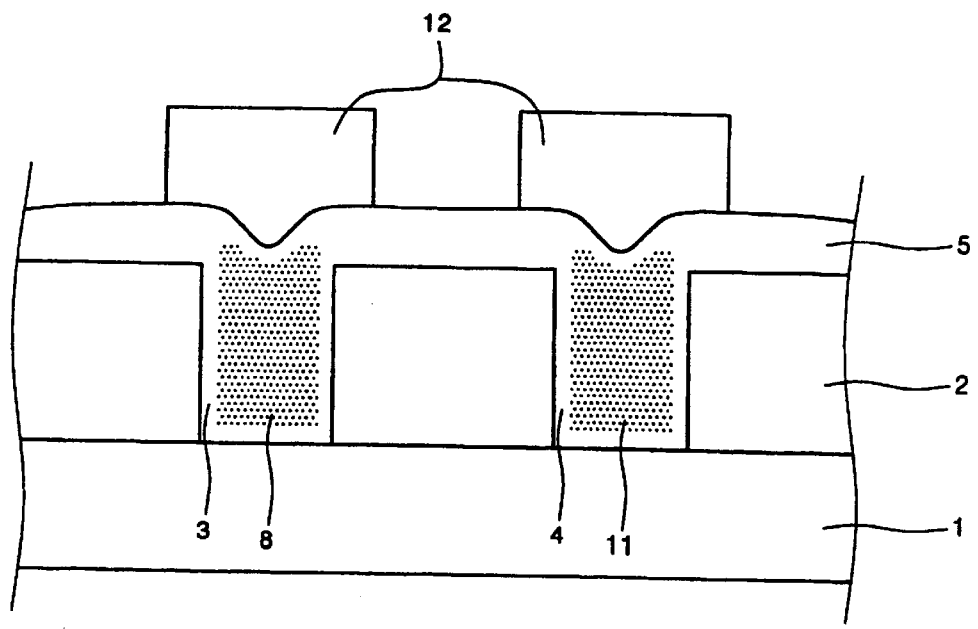
Figure 1G:
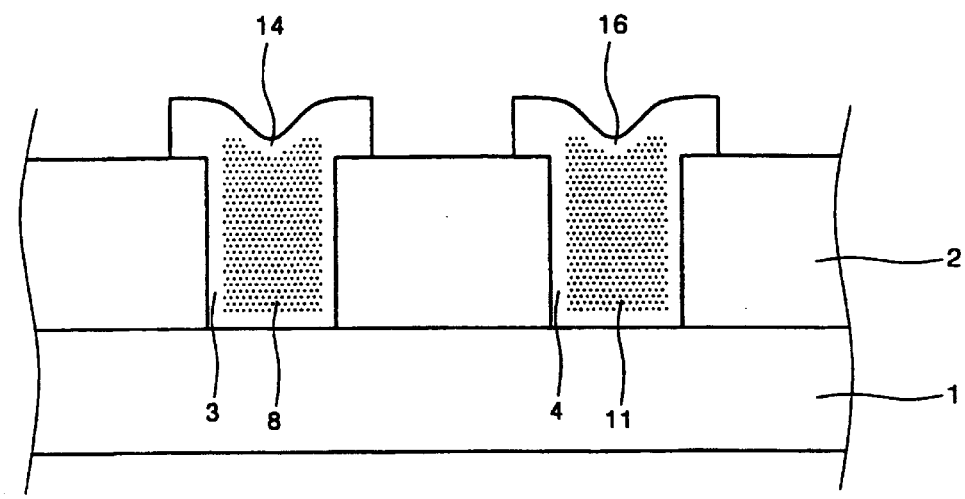
Figure 2A:
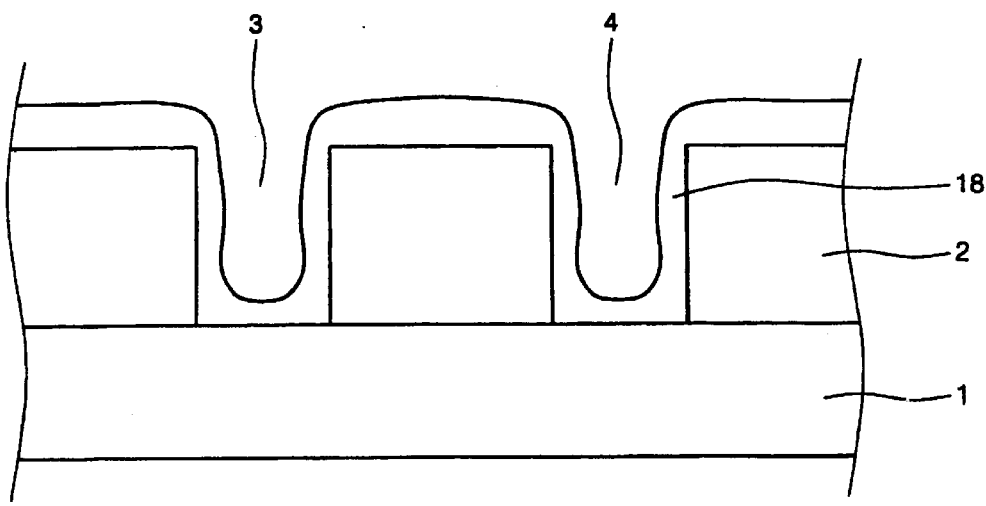
FIGS. 2a and 2b illustrate sequential steps of another conventional method for forming a junction electrode of a semiconductor device.
Figure 2B:
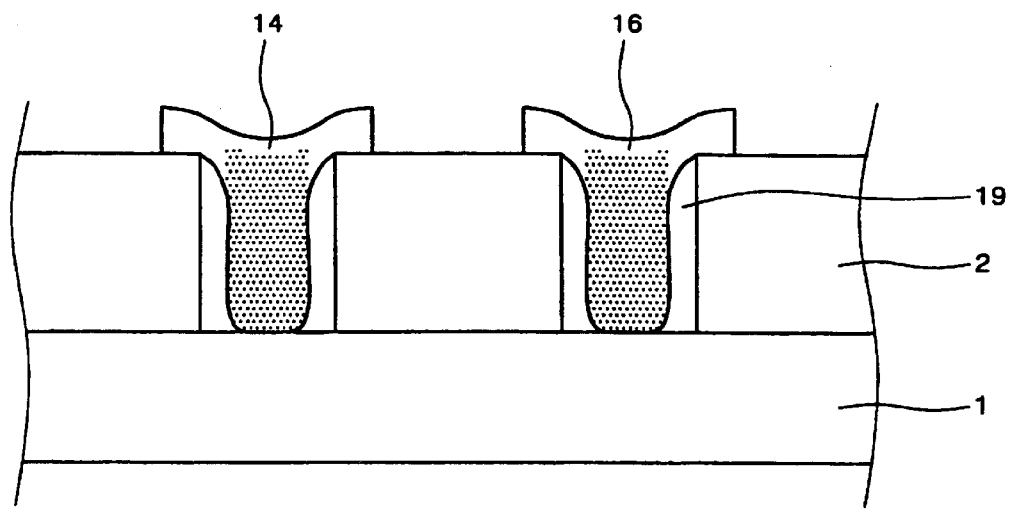
Figure 3A:
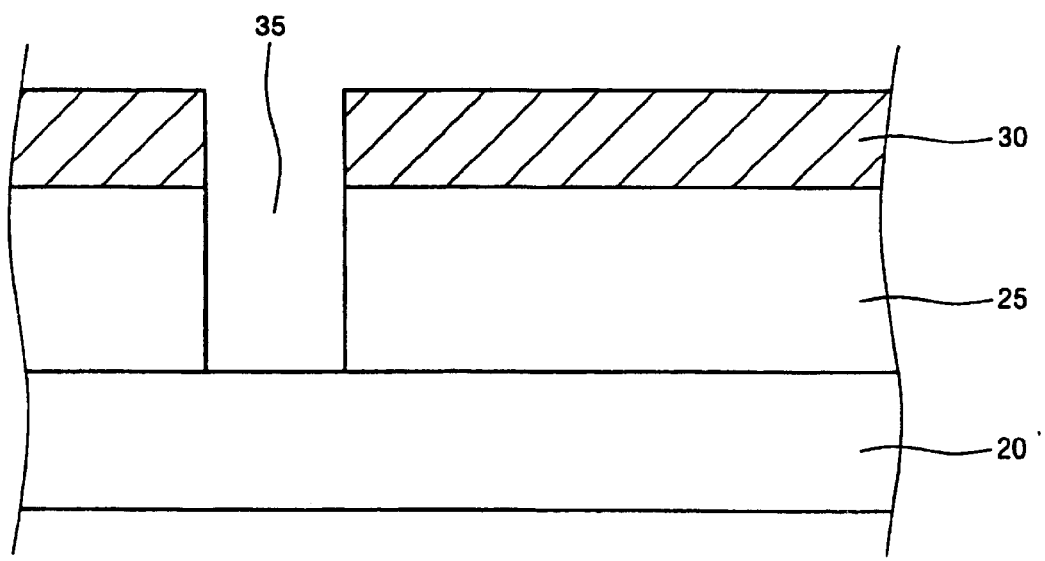
FIGS. 3a to 3f illustrate sequential steps for forming a junction electrode of a semiconductor device in accordance with the disclosed method.

As illustrated in FIG. 3a, an interlayer insulation film 25 is stacked on a semiconductor substrate 20 having a predetermined device structure. A first photoresist film 30 is stacked on the interlayer insulation film 25, and a masking etching is performed to form an n-type contact hole 35.

Figure 3B:
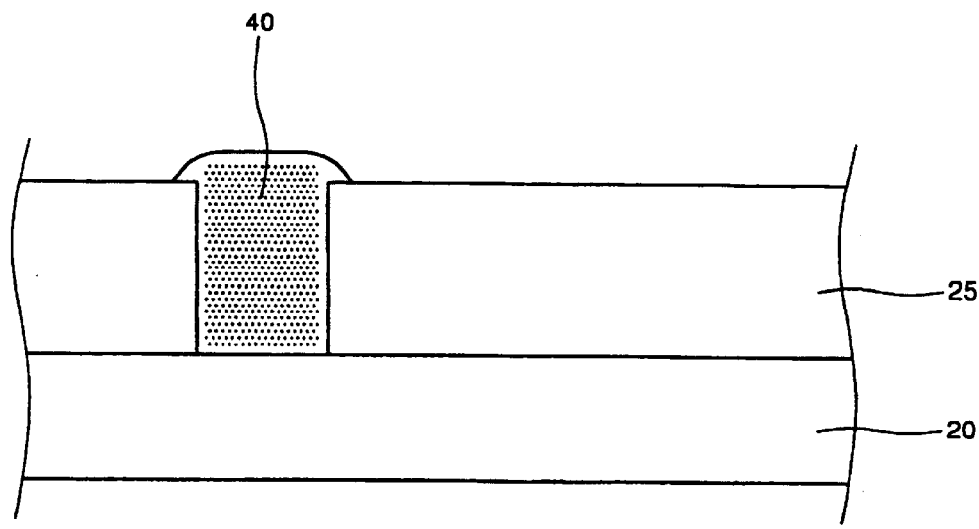

As shown in FIG. 3b, the first photoresist film 30 is removed, and an n-type junction electrode 40 is formed in the n-type contact hole 35 according to a selective epitaxial growth method. Here, the n-type junction electrode 40 is grown according to a selective epitaxial growth method using a Low Pressure-Chemical Vapor Deposition (LP-CVD) or Ultra-High Vacuum-Chemical Vapor Deposition (UHV-CVD) system.

In addition, a wet/dry cleaning process using either a combination of sulfuric acid and oxygenated water, or hydrofluoric acid is performed before growing the n-type junction electrode 40 according to the selective epitaxial growth method. In addition, the n-type junction electrode 40 is pre-treated under a pressure of about one to a few hundreds Torr, either in-chamber or in-situ, prior to the selective epitaxial growth method.

A source gas for growing the n-type junction electrode 40 according to the selective epitaxial growth method is at least one gas selected from the group consisting of dichlorosilane (DCS), HCl, $H_2$, $Si_2H_6$, $Cl_2$ and $GeH_4$ gases. The source gas may also be mixed with at least one gas selected from the group consisting of $PH_3$, $B_2H_4$ and $AsH_3$.

Figure 3C:
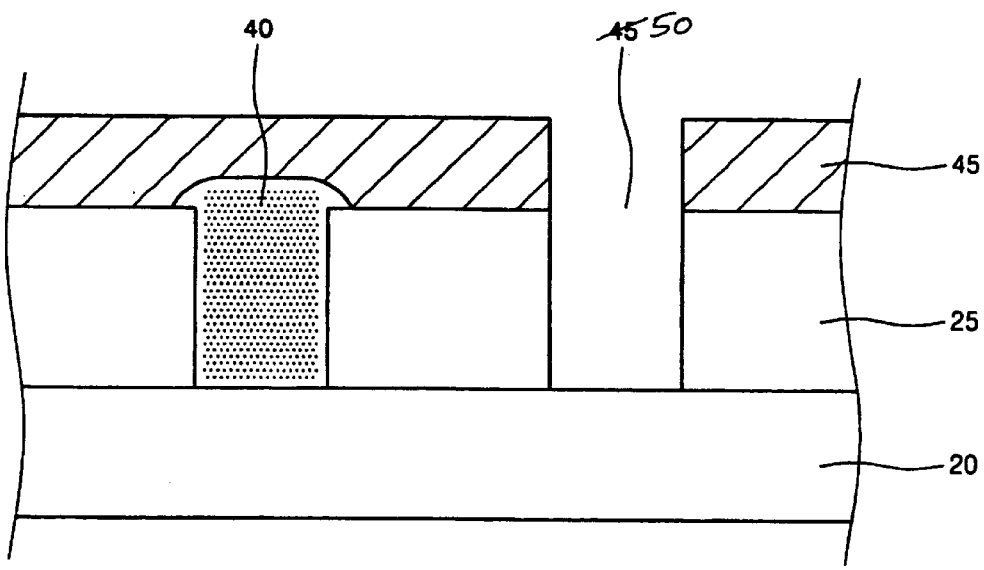

Referring to FIG. 3c, a second photoresist film 45 is stacked, and masking etching is performed to form a p-type contact hole 50.

Figure 3D:
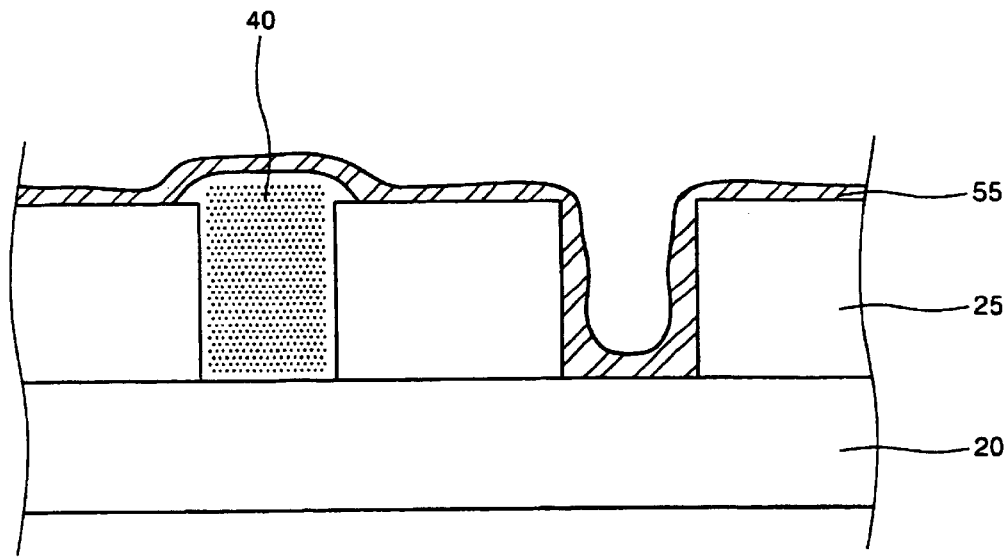

As illustrated in FIG. 3d, the second photoresist film 45 is removed and a spacer film 55 is stacked and also used to filled the p-type contact hole 50.

Figure 3E:
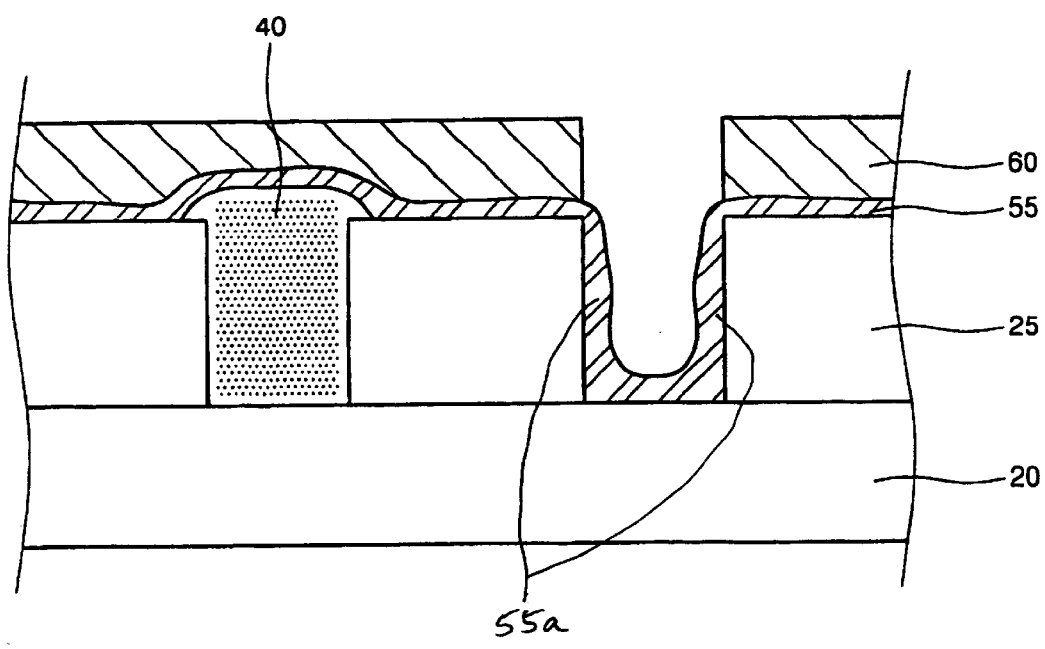

As depicted in FIG. 3e, a third photoresist film 60 is stacked to open the p-type contact hole 50, and spacers 55a are formed in the inside walls of the p-type contact hole 50.

Thereafter, the third photoresist film 60 is removed and a p-type junction electrode 65 is formed by growing silicon in the p-type contact hole 50 according to the selective epitaxial growth method. Preferably, the p-type junction electrode 65 is grown according to a selective epitaxial growth method using a LP-CVD or UHV-CVD system.

The wet/dry cleaning process using sulfuric acid and oxygenated water, or hydrofluoric acid is performed before growing the p-type junction electrode 65 according to the selective epitaxial growth method.

The p-type junction electrode 65 is pre-treated under a pressure of about one to a few hundreds Torr, either in-chamber or in-situ, prior to the selective epitaxial growth method.

Advantageously, a source gas for growing the p-type junction electrode 65 according to the selective epitaxial growth method is at least one gas selected from the group consisting of DCS, HCl, $H_2$, $Si_2H_6$, $Cl_2$ and $GeH_4$ gases. The source gas may also be mixed with at least one gas selected from the group consisting of $PH_3$, $B_2H_4$ and $AsH_3$.

Figure 3F:
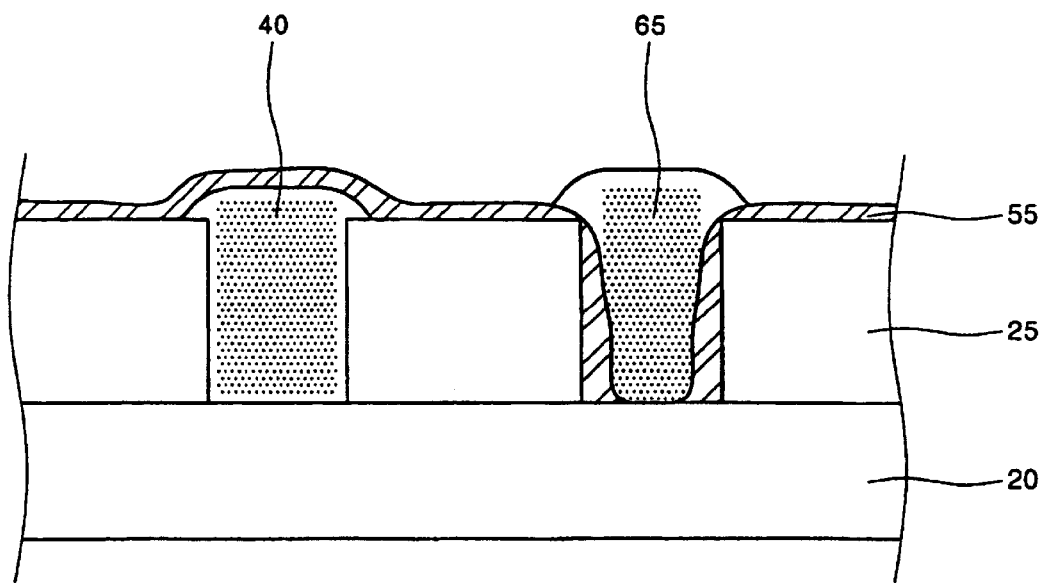

Alternatively, an electrode similar to the n-type junction electrode 40 shown in FIG. 3f may be filled in the p-type contact hole 50 without the spacers 55a formed on the inside walls of the p-type junction electrode 65.

In accordance with the disclosed method, the gate is formed on the semiconductor substrate by using a predetermined device structure, the contact hole is formed by stacking the interlayer insulation film on the gate, and the n-type and p-type junction electrodes are formed in the contact hole according to the epitaxial growth method, thereby preventing defects due to implantation and improving yields of the semiconductor devices.

Moreover, the selective silicon growth method may be employed in a narrow junction portion, which reduces a number of processes, prime cost, and time. The resultant performance of the electrode is exemplary and homogeneous, which has not been previously achieved using the general implantation method of the conventional art.

Although particular methods are disclosed herein, the scope of the coverage of this disclosure is not limited thereto. On the contrary, the present disclosure covers all embodiments of the disclosed method fairly falling within the scope of the appended claims, either literally or under the doctrine of equivalents.

What is claimed is:

1. A method for forming a junction electrode of a semiconductor device, the method comprising:

forming an n-type contact hole by stacking an interlayer insulation film directly on a semiconductor substrate having a predetermined device structure without intervening layers disposed therebetween, stacking a first photoresist film on the interlayer insulation film and masking etching the resultant structure so that the n-type contact hole extends through the interlayer insulating film to the substrate;

growing an n-type junction electrode in the n-type contact hole using a selective epitaxial growth method;

removing the first photoresist film;

forming a p-type contact hole by stacking a second photoresist film and masking etching the resultant structure so that the p-type contact hole extends through the interlayer insulating film to the substrate;

removing the second photoresist film;

filling the p-type contact hole with a spacer film;

stacking a third photoresist film except for a portion over the p-type contact hole;

forming spacers out of the spacer film on inside walls of the p-type contact hole; and growing a p-type junction electrode by growing silicon in the p-type contact hole using the selective epitaxial growth method.

2. The method according to claim 1, wherein the selective epitaxial growth method for growing the n-type junction electrode is Low Pressure Chemical Vapor Deposition or Ultra High Vacuum Chemical Vapor Deposition.

3. The method according to claim 1, wherein a wet/dry cleaning process using one of a combination of sulfuric acid and oxygenated water, and hydrofluoric acid is performed prior to growing the n-type junction electrode according to the selective epitaxial growth method.

4. The method according to claim 1, wherein the n-type junction electrode is pre treated under a pressure of about one to a few hundreds Torr prior to use of the selective epitaxial growth method.

5. The method according to claim 4, wherein the n-type junction electrode is pre-treated in one of in-chamber and in-situ.

6. The method according to claim 1, wherein a source gas for growing the n-type junction electrode using the selective epitaxial growth method is at least one gas selected from the group consisting of dichlorosilane, HCl, $H_2$, $Si_2H_6$, $Cl_2$ and $GeH_4$.

7. The method according to claim 6, wherein the source gas is mixed with at least one gas selected from the group consisting of $PH_3$, $B_2H_4$ and $AsH_3$.

8. The method according to claim 1, wherein the selective epitaxial growth method for growing the p-type junction electrode is Low Pressure-Chemical Vapor Deposition or Ultra High Vacuum-Chemical Vapor Deposition.

9. The method according to claim 1, wherein a wet/dry cleaning process using one of a combination of sulfuric acid and oxygenated water, and hydrofluoric acid is performed before growing the p-type junction electrode using the selective epitaxial growth method.

10. The method according to claim 1, wherein the p-type junction electrode is pre-treated under a pressure of about one to a few hundreds Torr, prior to the use of selective epitaxial growth method.

11. The method according to claim 10, wherein the p-type junction electrode is pre-treated in one of in-chamber and in-situ.

12. The method according to claim 1, wherein a source gas for growing the p-type junction electrode using the selective epitaxial growth method is at least one gas selected from the group consisting of dischlorosilane, HCl, $H_2$, $Si_2H_6$, $Cl_2$ and $GeH_4$.

13. The method according to claim 12, wherein the source gas is mixed with at least one gas selected from the group consisting of $PH_3$, $B_2H_4$ and $AsH_3$.

* * * * *

UNITED STATES PATENT AND TRADEMARK OFFICE
CERTIFICATE OF CORRECTION

PATENT NO. : 6,667,220 B2
DATED : December 23, 2003
INVENTOR(S) : Kwang-seok Jeon et al.

It is certified that error appears in the above-identified patent and that said Letters Patent is hereby corrected as shown below:

<u>Title page,</u>
Item [75], Inventors, please delete both instances of "Icheon-shi" and replace with -- Gyunggi-do -- in both instances.

Signed and Sealed this

Eleventh Day of May, 2004

JON W. DUDAS
*Acting Director of the United States Patent and Trademark Office*